US011352693B1

(12) United States Patent
Dwivedi (10) Patent No.: US 11,352,693 B1
(45) Date of Patent: Jun. 7, 2022

(54) BORON ALUMINUM OXIDE COMPOUND DEPOSITED BY ATOMIC LAYER DEPOSITION ON PRODUCT USED FOR RADIATION SHIELDING

(71) Applicant: United States of America as represented by the Administrator of NASA, Washington, DC (US)

(72) Inventor: Vivek Dwivedi, Greenbelt, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 0 days.

(21) Appl. No.: 16/857,641

(22) Filed: Apr. 24, 2020

(51) Int. Cl.
*C23C 16/44* (2006.01)
*C23C 16/40* (2006.01)
*C23C 16/04* (2006.01)
*C23C 16/26* (2006.01)
*C23C 16/455* (2006.01)

(52) U.S. Cl.
CPC .......... *C23C 16/403* (2013.01); *C23C 16/045* (2013.01); *C23C 16/26* (2013.01); *C23C 16/4408* (2013.01); *C23C 16/4417* (2013.01); *C23C 16/45555* (2013.01)

(58) Field of Classification Search
CPC .................................................. C23C 16/045
See application file for complete search history.

(56) References Cited

U.S. PATENT DOCUMENTS

| | | | | |
|---|---|---|---|---|
| 9,475,263 B1* | 10/2016 | Rangan | .................. | B32B 27/00 |
| 2016/0293410 A1* | 10/2016 | Lei | .................... | C23C 16/45536 |
| 2019/0062915 A1* | 2/2019 | Mane | .................. | C23C 16/4408 |

* cited by examiner

*Primary Examiner* — David P Turocy
(74) *Attorney, Agent, or Firm* — Matthew F. Johnston; Bryan A. Geurts; Helen M. Galus (57) ABSTRACT

The present invention relates to utilizing atomic layer deposition (ALD) techniques to deposit a layer of boron compound in a light-weight composite carbon-based foam derived from natural precursors, graphene, or other carbon-based materials, to minimize the effects of radiation in space applications. A method of manufacturing radiation shielding material includes: preparing a carbon-based foam product in a predetermined volume; and doping the carbon-based foam product by depositing a boron or boron-10 aluminum oxide ($B/B^{10}$—Al—O) compound using ALD in a vacuum chamber on either carbon-based foam or spherical silica particles prior to generating a carbon-based foam; wherein doping the carbon-based foam product includes depositing the $boron^{10}$-Al—O compound at a thickness of between one and two atomic percent of boron-10 within the carbon-based foam or on the silica particles; or coating a percentage of average foam pores (50% of average foam pore diameter) of the carbon-based foam product with the $boron^{10}$-Al—O compound.

5 Claims, 6 Drawing Sheets

BORON ALUMINUM OXIDE COMPOUND DEPOSITED BY ATOMIC LAYER DEPOSITION ON PRODUCT USED FOR RADIATION SHIELDING

ORIGIN OF THE INVENTION

The invention described herein was at least in-part made by an employee of the United States Government and may be manufactured or used by or for the Government of the United States of America for governmental purposes without the payment of any royalties thereon or therefor.

BACKGROUND OF THE INVENTION

1. Field of the Invention

The present invention relates to utilizing atomic layer deposition (ALD) techniques to deposit a layer of boron compound in an extremely light weight foam product used for radiation shielding, especially gamma radiation shielding.

2. Description of the Related Art

According to the "Vision for Space Exploration", NASA plans to send astronauts back to the Moon and eventually, set up an outpost there. For people to live and work safely extra-terrestrially, minimizing the physiological changes caused by space radiation exposure, as well as protecting technology hardware from radiation damage, especially in lunar environments, have been identified as important goals by NASA for accomplishment.

More specifically, the space environment contains major hazards to space travel, among which are space radiation and micrometeoroid and orbital debris (MMOD). Space radiation includes mainly electrons and protons, solar energetic particles (SEP), and galactic cosmic radiation (GCR). Space radiation can penetrate habitats, spacecraft, equipment, spacesuits, and can cause harm to astronauts. Minimizing the physiological changes caused by space radiation exposure is one of the biggest challenges in keeping astronauts fit and healthy as they establish a presence on the moon and travel through the solar system.

Furthermore, the preservation of components including science instruments and electronic boards due to anomalies caused by radiation effects is paramount for lunar mission success.

Current radiation shielding technologies involve either very thick aluminum panels or a large volume of hydrogen-containing compounds. Thus, finding a light weight radiation shielding technology that allows for radiation capture for in-orbit to deep space environments for hardware and human life protection, is desired.

SUMMARY OF THE INVENTION

The present invention relates to utilizing atomic layer deposition (ALD) techniques to deposit a layer of boron compound in an extremely light weight composite carbon-based foam product derived from natural precursors, graphene, or similar carbon-based foams, with the purpose of minimizing the effects of radiation, particularly in space applications.

The present invention modifies carbon-based foams to achieve porous foams which are light weight and are analogous to aerogels without the brittle structure. The enhancement of these foams with radiation shield atoms is accomplished via ALD.

More specifically, the present invention relates to a novel composite light-weight structure doped with the radiation-shielding atom boron, that, in one exemplary embodiment, utilizes a carbon-based foam material, such as "green" tannin-based foams taken from natural resources such as the bark of a *mimosa* tree. The carbon-based foam material, such as a boron or boron-10 aluminum oxide/nitride-doped *mimosa* tannin-based foam, and in another exemplary embodiment of a carbon-based foam—i.e., a graphene-based foam—are utilized with atomic layer deposition (ALD), to deposit the necessary 1-by-weight-percent (1 wt. %) of the boron compound in an extremely light-weight foam for radiation shielding, especially gamma radiation shielding.

In one embodiment, a method of manufacturing a product used in radiation shielding, includes: doping a carbon-based foam product in a predetermined volume by: depositing a boron or boron-10 aluminum oxide ($B/B^{10}$—Al—O) compound using atomic layer deposition (ALD) in a vacuum chamber on one of a carbon-based foam or on a plurality of silica particles; wherein doping the carbon-based foam product includes one of: depositing the boron or boron-10 aluminum oxide compound at a thickness one of between one and two atomic percent of boron-10 within the carbon-based foam or on the plurality of silica particles; or coating a predetermined percentage of average foam pores of said carbon-based foam with said boron or boron-10 acid aluminum oxide compound.

In one embodiment, the doping of the carbon-based foam using ALD further includes: placing the carbon-based foam inside the vacuum chamber; heating the vacuum chamber to 100° Celsius using a plurality of resistive heaters; measuring an internal temperature of the vacuum chamber; establishing a vacuum in the vacuum chamber using a vacuum pump; and depositing the boron or boron-10 aluminum oxide compound in the carbon-based foam by a sequential exposure of a plurality of components including trimethyl aluminum (TMA), water, and $boric^{10}$ acid methanol mixture (B10M) until the between one and two atomic percent of the boron-10 is present within the carbon-based foam or on the plurality of silica particles, or the predetermined percentage of the average foam pores of the carbon-based foam is coated with the boric acid aluminum oxide compound.

In one embodiment, the plurality of components are introduced via a plurality of pneumatic valves into the vacuum chamber.

In one embodiment, the plurality of components are purged from the vacuum chamber through an output gate valve.

In one embodiment, argon is introduced into the vacuum chamber to accomplish the purge through the gate valve.

In one embodiment, the carbon-based foam is prepared by the following steps: providing a carbon-based powder in a five-to-one weight ratio to water; stirring a first mixture of the carbon-based powder, the water, and a predetermined amount of furfuryl alcohol to a predetermined weight; adding glutaraldehyde in water to the first mixture to obtain a second mixture, and stirring the second mixture; adding para-toluene sulfonic acid in water to the second mixture to obtain a third mixture and continuing mixing the third mixture to obtain the carbon-based foam; and hardening the carbon-based foam for 72 hours at room temperature.

In one embodiment, the carbon-based powder is tannin.

In one embodiment, the carbon-based foam is a three-dimensional (3D) graphene foam made by a chemical vapor deposition (CVD) processing.

In one embodiment, the CVD processing of the three-dimensional graphene foam includes: disposing a metal salt sample in the furnace; heating the graphene and the metal salt sample to 600° Celsius for two hours in a hydrogen-argon environment; adding methane to the hydrogen-argon environment to achieve a hydrogen-argon-methane environment; increasing a temperature of the furnace to 1000° Celsius in the hydrogen-argon-methane environment; cooling the graphene on the metal salt sample to 700° Celsius at a cooling rate of 50° Celsius per minute, and continuing cooling to room temperature at a cooling rate of 30° Celsius per minute, resulting in a graphene-coated metal foam; removing metal from the graphene-coated metal foam via etching in an iron-chloride (Fe—Cl) one molar solution for 24 hours to achieve the three-dimensional graphene foam; and drying the three-dimensional graphene foam at 60° Celsius for 24 hours.

In one embodiment, the metal salt sample is a nickel-chloride compressed disk.

In one embodiment, the depositing step of depositing the boron-aluminum-oxide compound in the carbon-based foam to obtain the boron or boron-10 aluminum oxide ($B/B^{10}$—Al—O) growth, includes: pulsing the TMA from a TMA source into the vacuum chamber for a time $T_1$; wherein the time $T_1$ is a time that a TMA input valve is opened from the TMA source to the vacuum chamber then closed after a predetermined amount of TMA is introduced into the vacuum chamber; holding the TMA in the vacuum chamber by closing the TMA input valve and an output gate valve of the vacuum chamber, for a residence time $R_1$; wherein $R_1$ is a time that the TMA is held in the vacuum chamber; purging TMA from the vacuum chamber using argon from an argon source for a purge time $P_1$; wherein $P_1$ is a time that an argon input valve connected to the argon source, is open to the vacuum chamber while the output gate valve is open; pulsing water from a water input valve from a water source, for a time $T_2$; wherein $T_2$ is a time that the water input valve connected to the water source is opened to the vacuum chamber; holding the water for a residence time $R_2$ in the vacuum chamber; wherein $R_2$ is a time that the water is held in the vacuum chamber when the water input valve and the output gate valve are both closed; purging the water from the vacuum chamber with the argon for a purge time $P_2$; wherein $P_2$ is a time that the argon input valve is open while the output gate valve is open; pulsing a boric$^{10}$ acid methanol (B10M) compound from a B10M source into the vacuum chamber for a time $T_3$, wherein $T_3$ is a time the B10M input valve connected to the B10M source, is opened to vacuum chamber; holding the B10M compound for a residence time $R_3$ in the vacuum chamber; wherein $R_3$ is a time that the B10M mixture is held in the vacuum chamber when the B10M input valve and the output gate valve are both closed; purging the B10M compound from the vacuum chamber using argon for a purge time $P_3$; wherein $P_3$ is a time that the argon input valve is open while the output gate valve is also open; and repeating the above steps until the thickness of the boron or boron-10 aluminum oxide compound is deposited at one of between one and two atomic percent of boron-10 within said carbon-based foam, or said predetermined percentage of average foam pores of said carbon-based foam are coated with said boron or boron-10 aluminum oxide compound.

In one embodiment, doping the carbon-based foam product further includes: depositing the boron or boron-10 aluminum oxide compound on the plurality of silica particles disposed in an open mesh basket in the vacuum chamber, to obtain a plurality of doped silica particles.

In one embodiment, the silica particles are 500 microns in diameter and fill 50% of said mesh basket.

In one embodiment, the mesh basket is rotated at 30 RPM and at 45° angle within the vacuum chamber.

In one embodiment, the vacuum chamber is held at 100° Celsius.

In one embodiment, the method further includes: mixing the doped silica particles with a carbon-based powder according to the methods described above, to obtain a particulate carbon-based foam with doped silica particles homogenously mixed therein.

In one embodiment, an apparatus configured to manufacture a material for radiation shielding, includes: a vacuum chamber configured to perform atomic layer deposition (ALD) on a product; a plurality of input valves into the vacuum chamber which introduce a plurality of components including trimethyl aluminum (TMA), water, and boric$^{10}$ acid methanol mixture (B10M) into the vacuum chamber from a plurality of corresponding sources to dope the product with a boron or boron-10 aluminum oxide ($B/B^{10}$—Al—O) compound; a purge input valve which introduces argon from an argon source into the vacuum chamber and purges the plurality of components from the vacuum chamber; an output gate valve which removes the plurality of components and the argon from the vacuum chamber; and a plurality of resistive heaters which heat the vacuum chamber to a predetermined temperature; wherein doping by the boron or boron-10 aluminum oxide compound is performed on the product such that one of a thickness of the boron or boron-10 aluminum oxide compound deposited on the product is at between one and two atomic percent of boron-10, or a predetermined percentage of average pores of the product are coated with the boron or boron-10 aluminum oxide compound.

In one embodiment, the product is one of a carbon-based foam or a plurality of silica particles coated with a carbon-based foam.

In one embodiment, the apparatus further includes: a mesh basket disposed in the vacuum chamber at a 45° angle, and rotatable at 30 RPM, the mesh basket which holds the plurality of silica particles; wherein the plurality of silica particles are 500 microns in diameter and fill 50% of the mesh basket.

In one embodiment, the carbon-based foam is one of a tannin foam or a graphene foam.

Thus, has been outlined, some features consistent with the present invention in order that the detailed description thereof that follows may be better understood, and in order that the present contribution to the art may be better appreciated. There are, of course, additional features consistent with the present invention that will be described below, and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWINGS

The description of the drawings includes exemplary embodiments of the disclosure and are not to be considered as limiting in scope.

DESCRIPTION OF THE INVENTION

The present invention relates to utilizing atomic layer deposition (ALD) techniques to deposit a layer of boron compound in an extremely light weight composite carbon-based foams derived from natural precursors, graphene, or similar carbon-based foams, with the purpose of minimizing the effects of radiation, particularly in space applications.

The present invention modifies carbon-based foams to achieve porous foams which are light weight and are analogous to aerogels without the brittle structure. The enhancement of these foams with radiation shield atoms is accomplished via ALD.

More specifically, the present invention relates to a novel composite light-weight structure doped with the radiation-shielding atom boron, that, in one exemplary embodiment, utilizes a carbon-based foam material, such as "green" tannin-based foams taken from natural resources such as the bark of a *mimosa* tree. The carbon-based foam material, such as a boron or boron-10 aluminum oxide/nitride-doped *mimosa* tannin-based foam, and in another exemplary embodiment of a carbon-based foam—i.e., a graphene-based foam—are utilized with atomic layer deposition (ALD), to deposit the necessary 1-by-weight-percent (1 wt. %) of the boron compound in an extremely light-weight foam for radiation shielding, especially gamma radiation shielding.

Atomic layer deposition (ALD) is a vapor phase technique capable of producing thin films of a variety of materials. ALD is a cost-effective nano-additive-manufacturing technique that allows for the conformal coating of substrates with atomic control in a benign temperature and pressure environment. Based on sequential, self-limiting reactions, ALD offers exceptional conformality on high-aspect ratio structures, thickness control at the Angstrom level, and tunable film composition.

A characteristic of the surface adsorption and reaction mechanisms in ALD is that they are normally self-limiting, allowing for atomically accurate control of nanometer (nm) thickness. Therefore, high uniformity and precise thickness control make ALD an attractive process for the creation of novel optical and other nano-scale devices.

Through the introduction of paired precursor gases, thin films can be deposited on a myriad of substrates ranging from glass, polymers, aerogels, metals, high aspect ratio geometries and powders. With these advantages, ALD has emerged as a powerful tool for many industrial and research applications. Thus, ALD provides a novel method to facilitate the production, optimization and protection of valuable spaceflight hardware.

The present invention utilizes the effectiveness of the ALD technique to modify the surfaces of these three-dimensional (3-D) allotropes of carbon, such as graphene and tannin-based materials or foams, as well as any other suitable carbon-based foam, in applications in radiation shielding utilizing a boron or boron-10 aluminum oxide compound or composite.

In the present invention, any suitable carbon-based foams can be used. In one exemplary embodiment, graphene foams are made by growing graphene using a chemical vapor deposition (CVD) process on a three-dimensional (3D) metal foam (or structure). The metal is then removed which leaves the graphene as a 3D foam. This foam is 95% porous and thus, extremely light in weight.

The ALD technique used on the graphene foam will utilize a benign boron precursor, boric acid, which is currently used as a fire retardant, in metal processing and finishing, and as an effective method to reduce friction in the carrom board game. Recent computation in the nuclear power industry has shown that 1-2% boron incorporation within concrete provides sufficient shielding from high energy radiation. Therefore, the exemplary graphene foam can provide the structural substrate needed without a sacrifice in weight. In addition, the incorporation of boron within this structure of graphene foam provides effective protection from space-based radiation.

In another exemplary embodiment, organic or "green" carbon-based materials may be used for the carbon-based foam material. In one exemplary embodiment, the present invention utilizes tannins as carbon-based foam material, tannins which are natural materials that are universal in the plant ecosystem. Tannins are extracted from various tree barks and from the outer skin from various fruits such as grapes. Tannins are divided into two main classes: 1) condensed, and 2) polyflavonoid. Their structure is based on aromatic rings and, therefore, can be readily polymerized to porous structures. These structures utilize "green" ingredients that are not detrimental to the environment or to human health.

Natural tannin "green"-based foams, as well as graphene foam, are just two exemplary embodiments of carbon-based foam materials that can be used in the present invention, to deposit a composite of low "z" atoms, boron and hydrogen, along with aluminum and oxygen, that have shown to provide an effective method for radiation shielding (i.e., in nuclear power plants). By simply utilizing a boron precursor along with a standard alumina ALD process, a composite of aluminum boron oxide can be deposited conformally within the porous tannin or graphene foam structure in the methods of the present invention.

Procedures to Obtain Carbon-Based Foams

In order to further explicate the use of carbon-based foams in the present invention, the following procedures provide exemplary methods of obtaining exemplary carbon-based foams that can be used in the ALD process to achieve a material that would provide the requisite radiation shielding.

A) Exemplary "Green" Foams

Step 100: In one exemplary embodiment of the present invention (see FIG. 1), the ingredients to manufacture the carbon-based foam are provided. In order to obtain a desired weight and/or volume of a carbon-based material (such as tannin, a "green" material), an exemplary carbon-based-material-to-water-weight ratio is used (e.g., five-to-one weight ratio of tannin to water), along with an exemplary amount of additional ingredients to grow the carbon-based foam. However, one of ordinary skill in the art would know that the type of ingredients, and the ratio of ingredients could be varied as long as the desired volume and characteristics of the carbon-based foam could be generated.

Figure 1:
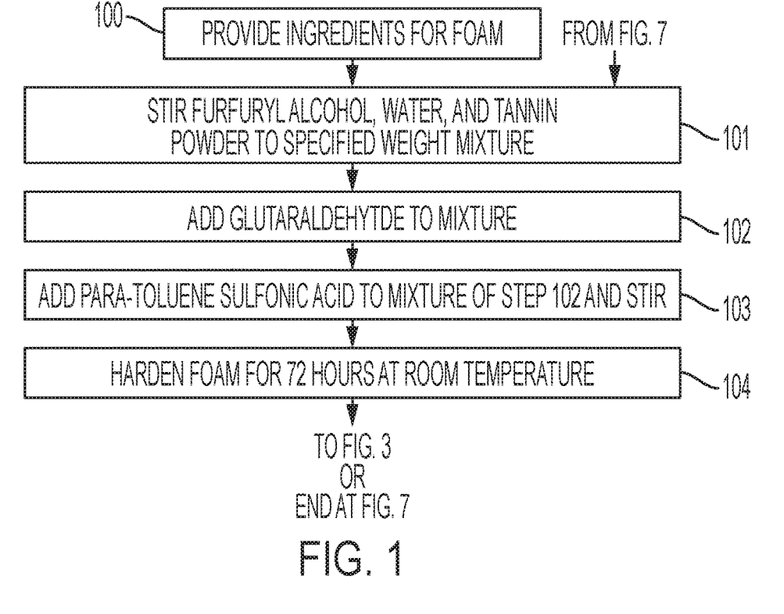
FIG. 1. Is a flowchart which describes the exemplary steps performed to obtain a carbon-based foam used in an ALD process to achieve a material providing radiation shielding, according to one embodiment consistent with the present invention.

Thus, the following exemplary ingredients in the following exemplary amounts, are provided to manufacture a tannin-based foam: 30 grams (g) commercial tannin powder, 6 g water, 11 g of 65 weight-percent (wt. %) para-toluene sulfonic acid in water, 21 g furfuryl alcohol, and 0.4 g of 65 wt. % glutaraldehyde in water.

Step 101: Based upon the above ratios of ingredients to create a tannin-based foam, mechanical stirring is performed of a mixture of 21 g furfuryl alcohol, 6 g water, and 30 g tannin powder mixture, the mixture being prepared to an exemplary weight—in this instance, a specified weight of 57 g.

Step 102: An amount of 0.4 g of 65 wt. % glutaraldehyde in water is added to the mixture of step 101, and the mixture is further stirred.

Step 103: An amount of 11 g of 65 wt. % para-toluene sulfonic acid in water is added to the mixture of step 102, and repeated mechanical mixing or stirring is performed.

Step 104: The resulting tannin-based foam is hardened for 72 hours at room temperature.

B) Other Carbon-Based Foams

In an exemplary embodiment of another type of foam that can be manufactured according to the methods of the present invention, a three-dimensional (3D) graphene foam can be made via a chemical vapor deposition (CVD) processing. Alternatively, in yet another embodiment, the graphene foam in the desired volume can be purchased commercially. The following exemplary steps (see FIG. 2) are performed to manufacture am exemplary carbon-based graphene foam.

Figure 2:
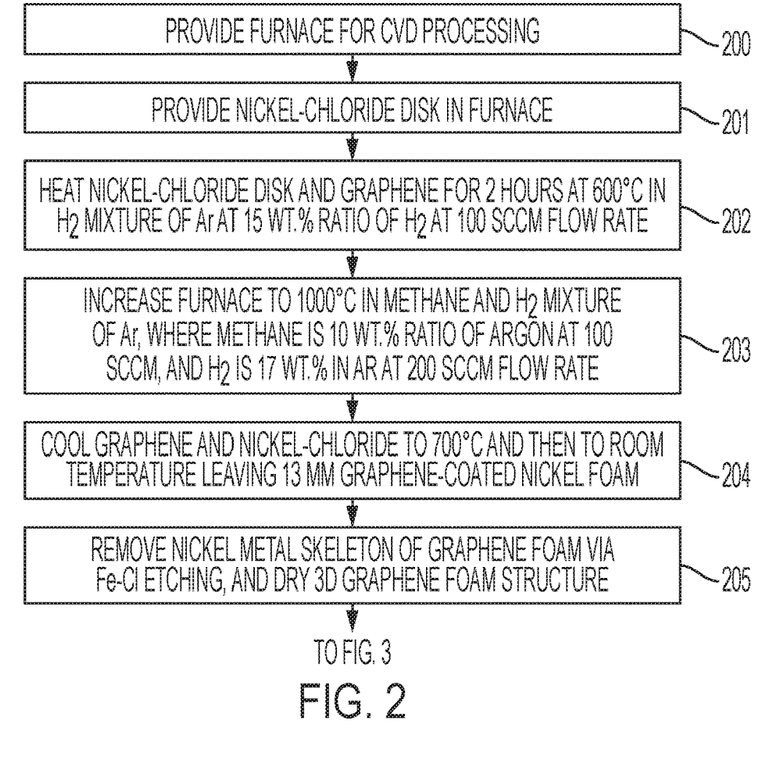
FIG. 2 is a flowchart which describes the exemplary steps to obtain a three-dimensional (3D) carbon-based foam, in this case, graphene, by a chemical vapor deposition (CVD) processing, to achieve a material providing radiation shielding, according to one embodiment consistent with the present invention.

In an exemplary embodiment, to manufacture a graphene foam, a mono- or multi-layer graphene is made in a furnace that heats to 1000° Celsius (C), to achieve the desired sample volume (i.e., 13 mm diameter foam).

Step 200: Provide a furnace capable of heating to 1000° Celsius (C) and performing CVD processing.

Step 201: An exemplary metal salt (i.e., nickel salt or copper salt) sample is provided in the furnace to deposit the graphene in a foam structure, as the furnace is heated and an added methane gas decomposes. In one exemplary embodiment, a 13 mm diameter sample of compressed nickel-chloride (Ni—Cl) powdered disk is placed in the furnace.

Step 202: The nickel-chloride compressed disk is heated to 600° Celsius for two (2) hours in a hydrogen ($H_2$) mixture of argon (Ar) environment at a 15 wt. % ratio of hydrogen, at a flow rate of 100 standard cubic centimeters per minute (SCCM). This allows the graphene foam to occur.

Step 203: The graphene and nickel-chloride disk sample are kept in the same furnace of 15 minutes while increasing the temperature to 1000° Celsius in a methane and hydrogen mixture of argon environment, where the methane ($CH_3$) is at 10 wt. % ratio of argon at 100 SCCM, and hydrogen is in 17 wt. % in argon at a flow rate of 200 SCCM. This allows the graphene to grow into a foam.

Step 204: The graphene is cooled on the 13 mm nickel-chloride sample to 700° Celsius at a cooling rate of 50° Celsius per minute, followed by continued cooling to room temperature at a cooling rate of 30° Celsius per minute, resulting in a 13 mm graphene-coated nickel foam.

Step 205: The nickel metal skeleton of the graphene foam is removed via etching in an iron-chloride (Fe—Cl) 1 molar solution for 24 hours, then the graphene is dried at 60° Celsius for 24 hours, leaving a visible, porous 3D graphene foam structure maintaining the initial 13 mm diameter.

In one embodiment according to the exemplary process above, the 3D graphene foam structure that results has a high surface area, while maintaining most of two-dimensional (2D) graphene's properties.

Thus, CVD processing of graphene foam opens a cost-effective route for engineering a new class of ultra-light, highly conductive graphene-based materials with exceptional mechanical strength, flexibility, and elasticity.

Doping of Foams via Atomic Layer Deposition

In one embodiment of the present invention, doping of the desired carbon foams, formulated in the desired volume, is performed via ex situ boric acid aluminum oxide atomic layer deposition (ALD). ALD is used as a cost-effective nano-additive-manufacturing technique that allows for the conformal coating of substrates with atomic control in a benign temperature and pressure environment. Through the introduction of paired precursor gases, thin films can be deposited on a myriad of substrates regardless of topography. By providing atomic layer control, where single layers of atoms can be deposited, the fabrication of metal transparent films, precise nano-laminates, and coatings of nano-channels and pores is achievable.

Figure 3:
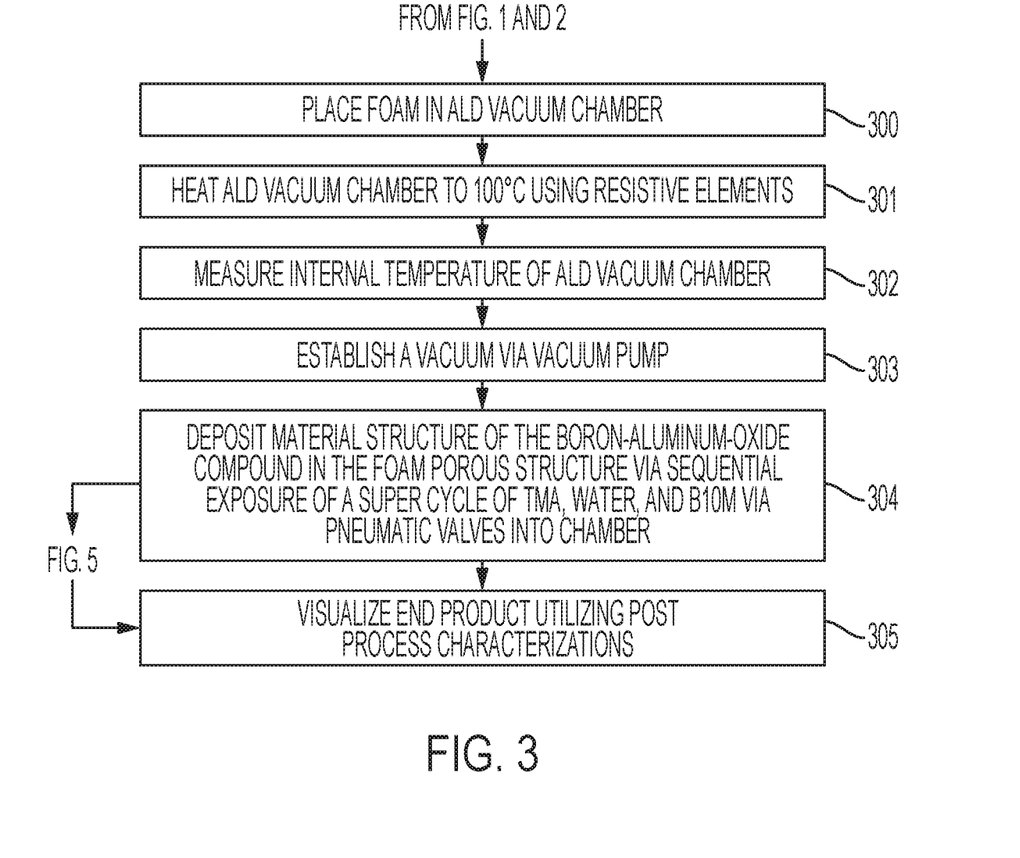
FIG. 3 is a flowchart showing the exemplary steps in doping of the desired carbon-based foams of FIG. 1 or FIG. 2, by ex situ boric acid aluminum oxide atomic layer deposition (ALD).
Figure 4:
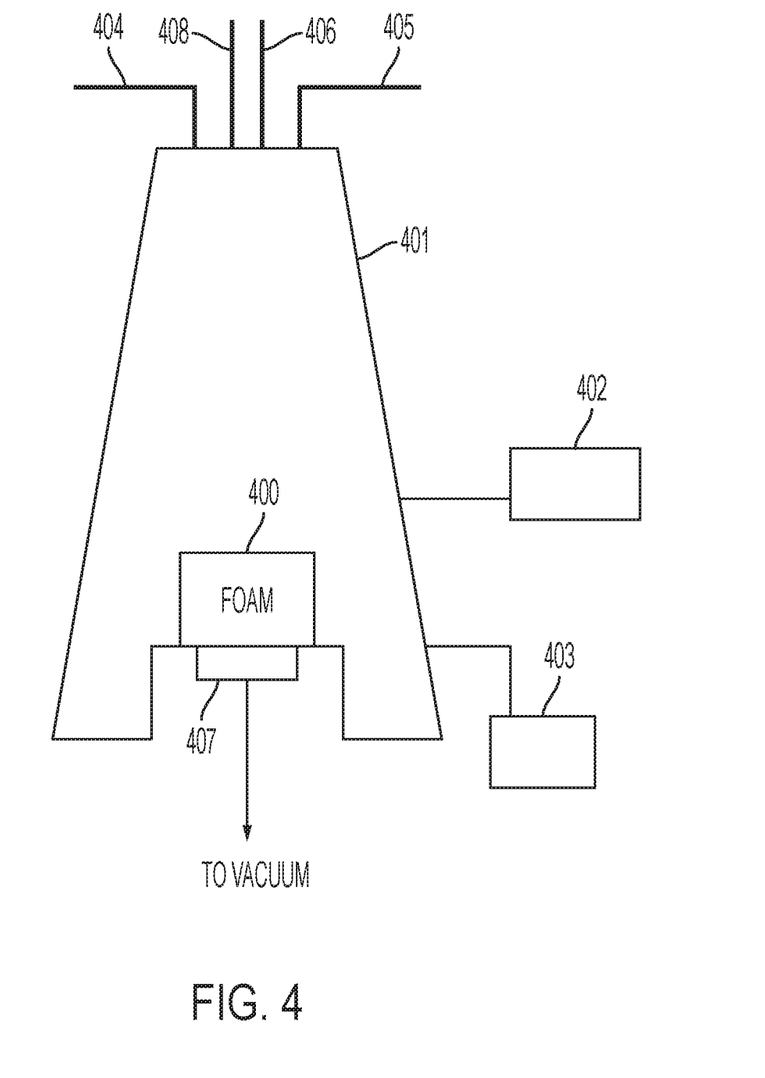
FIG. 4 is an exemplary apparatus used to perform the ex situ boric acid aluminum oxide atomic layer deposition (ALD) described in FIG. 3, of the carbon-based foams of FIG. 1 or FIG. or 2.

In order to dope the carbon-based foam achieved as an end-product from the above step 104 according to one embodiment, or the off-the-shelf graphene foam blocks, or graphene foam manufactured from the above step 205, according to yet another embodiment, the following exemplary steps (see FIG. 3) are performed, using FIG. 4 as an exemplary apparatus arrangement.

Step 300: The end-product carbon-based foam 400 is placed inside the atomic layer deposition (ALD) reactor or vacuum chamber 401.

Step 301: The ALD vacuum chamber 401 is heated to 100° Celsius using resistive elements or heaters 402.

Step 302: The internal temperature of the ALD vacuum chamber 401 is measured using a type K thermocouple (not shown).

Step 303: A vacuum in the vacuum chamber 401 is established via a chemical series vacuum pump 403 where the pressure is measured using a pressure transducer (not shown). The pressure in the chamber 401 is a function of the chamber 401 size and the vacuum pump 403.

Step 304: The material structure of the boron or boron-10 aluminum oxide ($B/B^{10}$—Al—O) compound or composite is deposited in the foam porous structure 400 via a sequential exposure of a super cycle of the following chemicals: trimethyl aluminum (TMA), water, and boric$^{10}$ acid methanol mixture (B10M), until 1-2% of boron-10 atomic percent is present within the foam structure 400 or a percentage of the average foam pores of the foam structure 400 (i.e., 50% of average foam pore diameter) are coated with the boron-10 aluminum oxide composite.

In one embodiment, the TMA, water, and B10M chemicals are held in 200 cc stainless steel bubblers (nor shown) and the chemicals are introduced into the vacuum chamber 401 via pneumatic input valve 404 (TMA), pneumatic input valve 405 (water) and pneumatic input valve 406 (B10M) in amounts that will achieve the desired 1-2% boron-10 atomic percent result. One of ordinary skill in the art would be able to achieve this result using the exemplary methods below.

In one embodiment, a commercially available boric compound—i.e., boric-10 acid—can be deposited along with alumina, via a three step ALD process where a boron-10-alumina complex is deposited (see below for an exemplary method). By utilizing ALD, the present invention allows the deposition of the desired 2-3-by-weight-percent of a boron-10 compound in an extremely light weight foam for radiation, especially gamma radiation shielding.

Step 305: The carbon-based foam end product is visualized utilizing post process characterizations to verify the boron-10 atomic percent or the percentage of the average pore size that has been coated. The boron-10 in the alumina complex allows for better gamma ray capture at a significant weight reduction and allows the shape of the foam to be maintained regardless of the temperature range from cryogenic to extreme heat.

Figure 5:
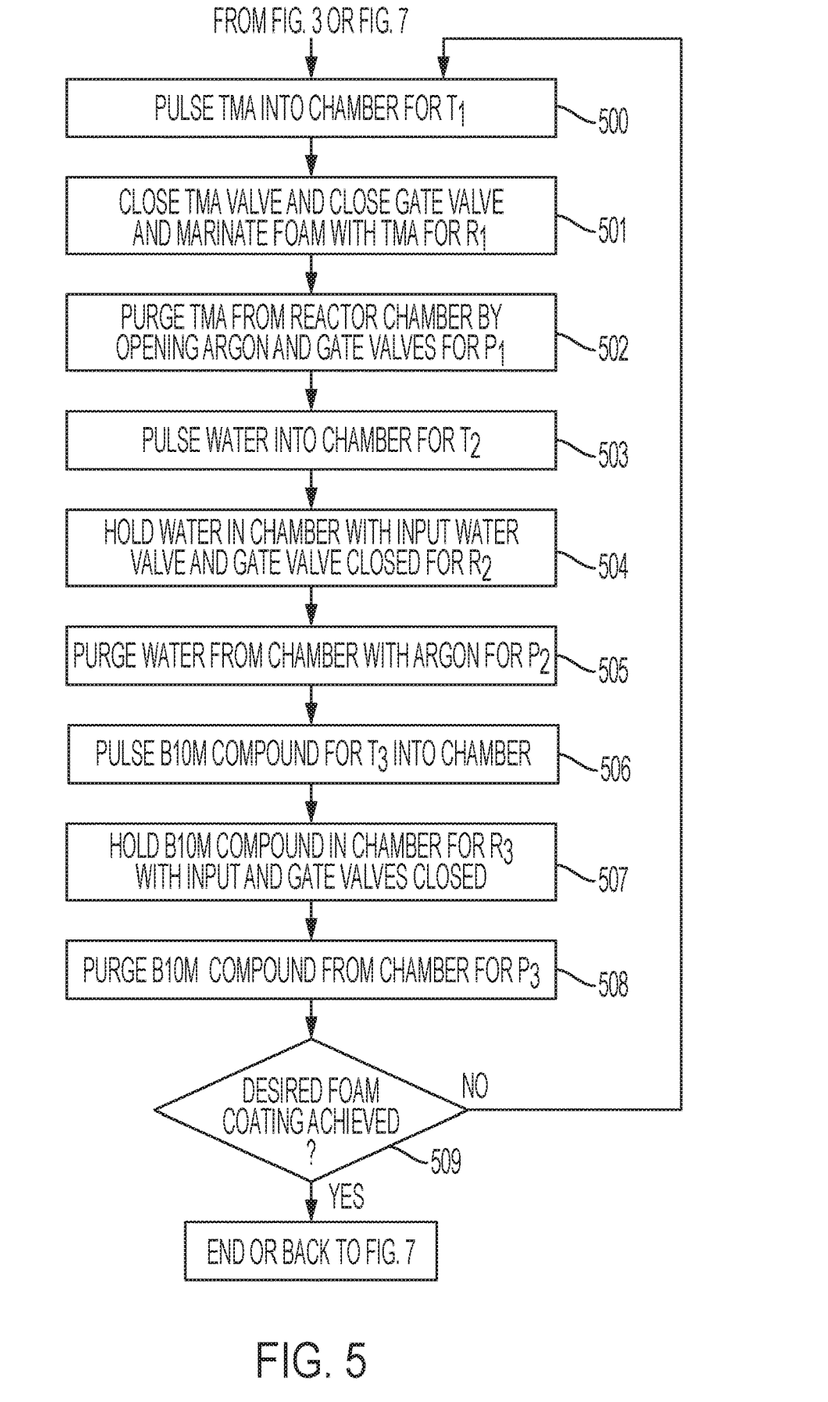
FIG. 5 is a flowchart showing the exemplary steps of the recipe to follow for the boron or boron-10 aluminum oxide ($B/B^{10}$—Al—O) growth used in the ex situ boric acid aluminum oxide atomic layer deposition (ALD) described in FIG. 3, of the carbon-based foams of FIG. 1 or FIG. 2.

In one exemplary embodiment, as shown in FIG. 5, the recipe to follow for the boron or boron-10 aluminum oxide ($B/B^{10}$—Al—O) growth is:

Step 500: pulse Trimethyl Aluminum (TMA) for Time $T_1$, where $T_1$ is the time (i.e., in seconds), that the pneumatic input valve 404 attached to the TMA source (not shown) is opened to the reactor or vacuum chamber 401, then closed after the desired amount of TMA is introduced into the vacuum chamber 401.

Step 501: hold TMA in the vacuum chamber 401 by closing the TMA input valve 404, and output gate valve 407, for Residence Time $R_1$, where $R_1$ is the time (i.e., in seconds) that the already introduced TMA is held in the vacuum chamber 401 to "chemically marinate" the foam 400.

Step 502: purge TMA from the reactor or vacuum chamber 401 volume with argon for Purge Time $P_1$, where $P_1$ is the time (i.e., in seconds) where the pneumatic input valve 408 for argon from an argon source (not shown) is open to the vacuum chamber 401 while the output gate valve 407 is also open, to remove all excess TMA and any byproducts of the TMA reaction from the chamber 401.

Step 503: pulse water from pneumatic input valve 405 for Time $T_2$, where $T_2$ is the time (i.e., in seconds) the input valve 405 attached to the water source (not shown) is opened to the vacuum chamber 401 then closed.

Step 504: hold water for Residence Time $R_2$ in the vacuum chamber 401, where $R_2$ is the time (i.e., in seconds) that water is held in the vacuum chamber 401 when the input valve 405 and output gate valve 407 are closed.

Step 505: purge water from reactor or vacuum chamber 401 volume with argon from an argon source (not shown), for Purge Time $P_2$, where $P_2$ is the time (i.e., in seconds) where the pneumatic input valve 408 for argon is open while the output gate valve 407 is also open to remove all excess water and any byproducts of the water reaction.

Step 506: pulse boric$^{10}$ acid methanol mixture (B10M) into vacuum chamber 401 for Time $T_3$, where $T_3$ is the time (i.e., in seconds) the pneumatic input valve 406 attached to the boric$^{10}$ acid methanol mixture source (not shown) is opened to vacuum chamber 401, then closed.

Step 507: hold the B10M compound for Residence Time $R_3$ in vacuum chamber 401, where $R_3$ is the time (i.e., in seconds) that the boric$^{10}$ acid methanol mixture is held in the vacuum chamber 401 when the input valve 406 and output gate valve 407 are closed, to "marinate" the foam 400.

Step 508: purge the B10M compound from the reactor or vacuum chamber 401 volume with argon from an argon source (not shown) for Purge Time $P_3$, where $P_3$ is the time (i.e., in seconds) where the pneumatic input valve 408 for argon is open while the output gate valve 407 is also open to remove all excess boric$^{10}$ acid Methanol mixture and any byproducts of the boric$^{10}$ acid Methanol mixture reaction from the vacuum chamber 401.

Step 509: If the desired thickness of 1-2% of boron-10 atomic percent is not present within the foam structure 400 or a percentage of the average foam pores of the foam structure 400 (i.e., 50% of average foam pore diameter) are not coated with the boron or boron-10 aluminum oxide composite or compound, then steps 500-508 are repeated. For a volume of foam 400 equivalent to 10% of the reactor 401 volume with micron sized pores, the following exemplary values for times $T_1$-$R_1$-$P_1$-$T_2$-$R_2$-$P_2$-$T_3$-$R_3$-$P_3$ can be used in the corresponding seconds: 1-10-5-1-5-5-1-10-10.

As noted above with respect to step 305, the carbon-based foam end product is visualized to verify that the boron-10 atomic percent or the percentage of the average pore size has been coated to the desired thickness.

Doping of Foams via Particulate ALD

In yet another embodiment consistent with the present invention, the doping process of the carbon-based foam is carried out in situ with boric acid aluminum oxide particles using atomic layer deposition (ALD). In this embodiment, the doping process involves the pre-process application of ALD of the boron or boron-10 aluminum oxide ($B/B^{10}$—Al—O) compound on spherical silica beads or particles (i.e., particulate), which are then mixed into the dried carbon-based ingredients obtained from the above exemplary embodiment of FIG. 1.

More specifically, the following exemplary process steps (see FIG. 7) of this embodiment are performed to deposit $B^{10}$—Al—O (B10M) compound on spherical silica beads or particles approximately 500 microns in diameter, using ALD in a modified reactor or vacuum chamber 401 (see FIG. 6) from the previous exemplary embodiment of FIG. 4. The reference numerals that apply to similar apparatus elements of FIG. 4 are given the same reference numerals in FIG. 6.

Figure 6:
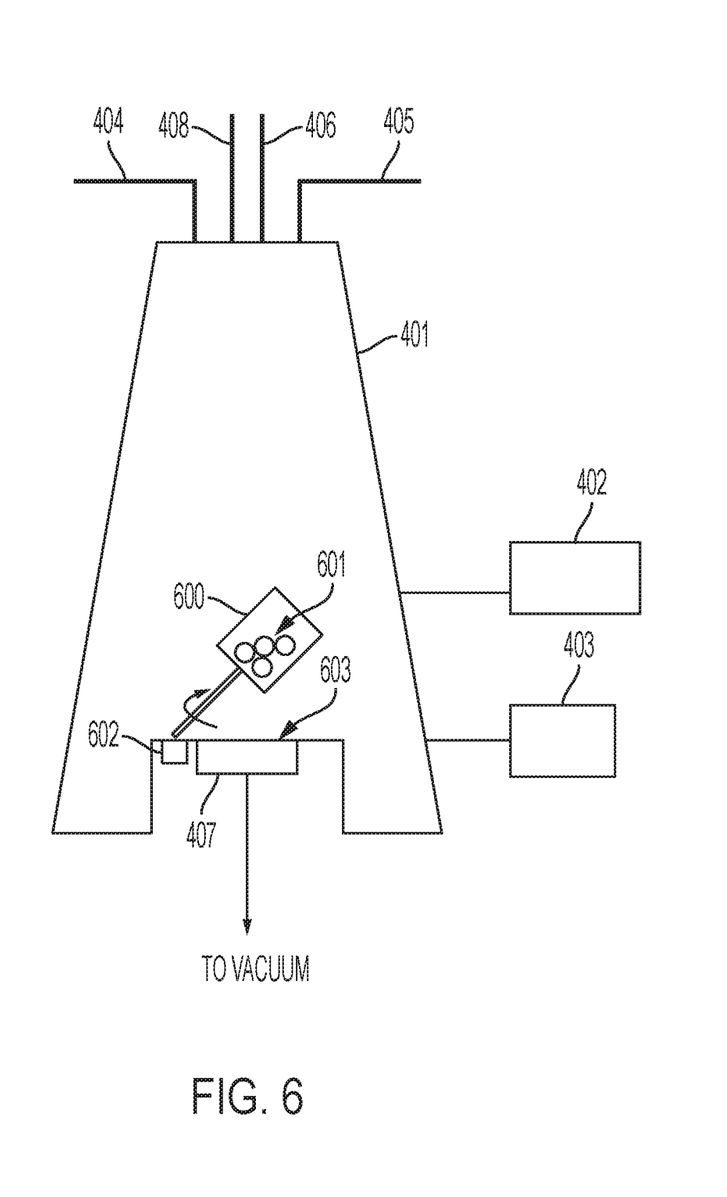
FIG. 6 is an alternative embodiment of an exemplary apparatus—modified from FIG. 4—and which is used to perform the doping process of carbon-based foam in situ with boric acid aluminum oxide particulate, the boric acid aluminum oxide being deposited on the particulate using atomic layer deposition (ALD). In this embodiment, the doping process involves the pre-process application of ALD of the boron or boron-10 aluminum oxide ($B/B^{10}$—Al—O) compound on spherical silica particulate or beads which are then mixed into the dried carbon-based ingredients obtained from the above exemplary embodiment of FIG. 1.
Figure 7:
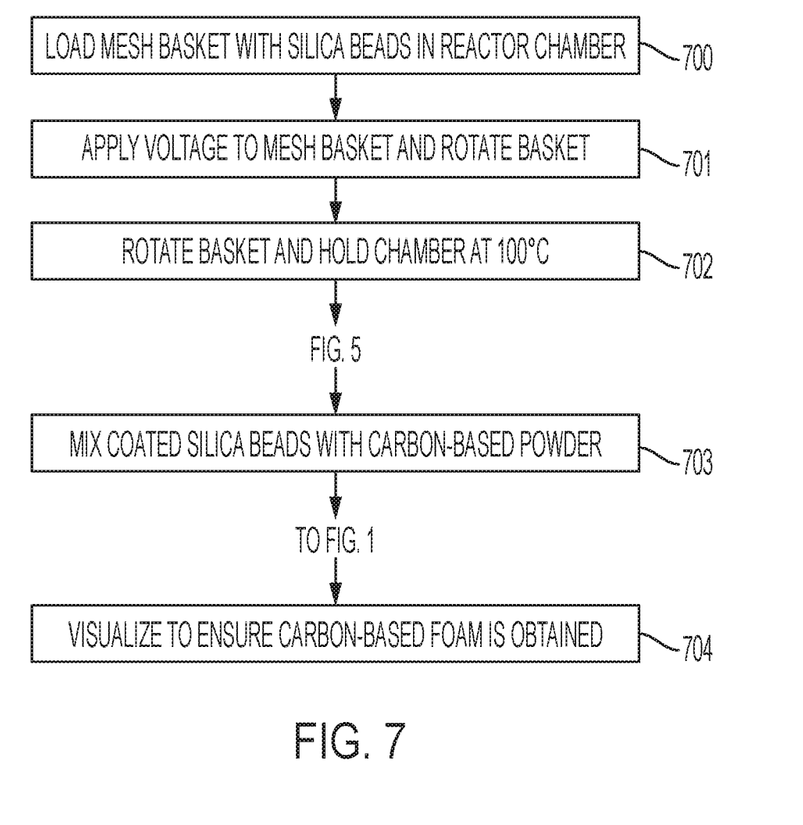
FIG. 7 is a flowchart showing the exemplary steps used to perform the doping process of the $B/B^{10}$—Al—O (B10M) compound deposited on spherical silica beads or particulate using ALD in the modified apparatus of FIG. 6.

Step 700: provide a mesh basket 600 in a reactor or vacuum chamber 401 and load spherical silica beads or particles 601 to about 50% of the mesh basket 600 volume.

Step 701: couple the mesh basket 600 to an electric motor 602 and apply a voltage such that a 30 RPM (revolution per minute) rotation of the basket 600 is achieved. The mesh is open from the top of the basket 600, and the overall basket 600 is held at 45° to the reactor or vacuum chamber 401 floor 602 to prevent the silica beads/particles 601 from falling out of the basket 600.

Step 702: rotate the basket 600 in the vacuum chamber 401, and hold the reactor or vacuum chamber 401 at 100° Celsius, to follow a similar recipe as described above and shown in FIG. 5, in the doping of the carbon foams via ex situ boric acid aluminum oxide ALD. Thus, steps 500-509 are then followed.

As noted above with respect to Step 509, the number of cycles (i.e., steps 500-509) performed will dictate the thickness of the boron or boron-10 aluminum oxide compound that will be deposited on the silica spheres/beads/particles 601. Thus, the steps are repeated as necessary, to ensure the appropriate boron-10 atomic percent 1-2% thickness is achieved. The following exemplary values for times $T_1$-$R_1$-$P_1$-$T_2$-$R_2$-$P_2$-$T_3$-$R_3$-$P_3$ can be used in the corresponding seconds: 1-10-5-1-5-5-1-10-10.

Step 703: mix the coated silica spheres/beads/particles 601 with the dry carbon-based powder mixture, such as a tannin powder mixture for making a tannin-based foam, as described in steps 100-104 above, and in FIG. 1. Thus, steps 101-104 are followed to achieve a particulate carbon-based (i.e., tannin-based) foam that includes said silica spheres/beads/particles 601 mixed therein in a homogenous manner.

Step 704: visualize the particulate carbon-based foam end product (i.e., tannin-based) to ensure that the foam achieves the desired homogenous inclusion of the beads/spheres/particles 601.

The above alternative process achieves a radiation shielding product that minimizes radiation in space applications, which allows protection of valuable spaceflight hardware and prevents harmful radiation to astronauts, such as in manned vehicles that will go to the Moon or Mars.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A method of forming a carbon-based foam with silica particles doped with boron-10 aluminum oxide (B10-Al—O) mixed therein; said method comprising:
    depositing boron-10 aluminum oxide (B10-Al—O) compound using atomic layer deposition (ALD) on said plurality of silica particles in an open mesh basket in a vacuum chamber; wherein said doping of said carbon-based foam product includes depositing said boron-10 aluminum oxide compound at a thickness of between one and two atomic percent of boron-10; and
    said step of preparing said carbon-based foam is prepared by the following steps:
    providing a carbon-based powder in a predetermined weight ratio to water;
    mixing said plurality of silica particles with said carbon based poweder;
    stirring a first mixture of said carbon-based powder, said water, and a predetermined amount of furfuryl alcohol to a predetermined weight;
    adding glutaraldehyde in water to said first mixture to obtain a second mixture and stirring the second mixture;
    adding para-toluene sulfonic acid in water to said second mixture to obtain a third mixture and continuing mixing said third mixture to obtain said carbon-based foam; and
    hardening said carbon-based foam for 72 hours at room temperature.

2. The method of claim 1, wherein said silica particles are 500 microns in diameter and fill 50% of said mesh basket.

3. The method of claim 2, wherein said mesh basket is rotated at 30 RPM and at 45° angle within said vacuum chamber.

4. The method of claim 3, wherein said vacuum chamber is held at 100° Celsius.

5. The method of claim 1, wherein said doping of said silica particles using ALD further comprises:
    placing said silica particles in said open mesh basket in said carbon-based foam inside said vacuum chamber;
    heating said vacuum chamber to 100° Celsius using a plurality of resistive heaters;
    measuring an internal temperature of said vacuum chamber;
    establishing a vacuum in said vacuum chamber using a vacuum pump; and
    depositing said boron or boron-10 aluminum oxide compound on said silica particles by a sequential exposure of a plurality of components including trimethyl aluminum (TMA), water, and boric 10 acid methanol mixture (B10M), until said between one and two atomic percent of said boron-10 is present on said plurality of silica particles.

* * * * *